United States Patent [19]

Fury et al.

[11] 4,340,618
[45] Jul. 20, 1982

[54] PROCESS FOR FORMING REFRACTORY METAL LAYERS ON CERAMIC SUBSTRATE

[75] Inventors: Michael A. Fury, Fishkill; Ananda H. Kumar, Wappingers Falls, both of N.Y.

[73] Assignee: International Business Machines Corporation, Armonk, N.Y.

[21] Appl. No.: 245,762

[22] Filed: Mar. 20, 1981

[51] Int. Cl.³ .................................................. H05K 3/12
[52] U.S. Cl. ............................................... 427/96; 29/851;
264/61; 427/98; 427/99; 427/124; 427/125;
427/376.3; 427/383.5
[58] Field of Search ............... 427/96, 98, 99, 125,
427/124, 97, 376.3, 383.5; 264/61; 29/848, 849,
851

[56] References Cited

U.S. PATENT DOCUMENTS

| | | | |
|---|---|---|---|
| 3,518,756 | 7/1970 | Bennett et al. | 427/125 |
| 3,978,248 | 8/1976 | Usami | 427/125 |
| 3,999,004 | 12/1976 | Chirno | 427/96 |
| 4,109,377 | 8/1978 | Blazick et al. | 427/96 |

FOREIGN PATENT DOCUMENTS 52-53732  4/1977  Japan .................. 427/125

OTHER PUBLICATIONS

Miller, "Metallization Paste Vehicle", IBM TDB, vol. 22, No. 4, Sep. 1979, p. 1435.
Kaiser et al., "A Fabrication Technique for Multilayer Ceramic Modules", Solid State Technology, May 1972.
Toth et al., "Activation Sintering of Tungsten", Journal of Less-Common Metals, vol. 19, pp. 157-167, (1965).
German et al., "Heterodiffusion Model for the Activated Sintering of Molybdenum", Journal of the Less-Common Metals, 58, 1978, 61-74.
Koopman, "Wettability Process", IBM TDB, vol. 17, No. 8, Jan. 1975, p. 2331.
Chance, "Green Ceramic Metallization", IBM TDB, vol. 12, No. 11, Apr. 1970, p. 1795.
Harvilchuck et al., "Cleaning Sintered Multilayer Ceramic Pad Surfaces for Plating", IBM TDB, vol. 19, No. 11, Apr. 1977, p. 415.
Haddad et al., "Activation of Catalyst for Electroless Plating on Molybdenum", IBM TDB, vol. 19, No. 3, Aug. 1976, p. 929.

Primary Examiner—John D. Smith
Attorney, Agent, or Firm—Wolmar J. Stoffel

[57] ABSTRACT

A process for forming a substantially glass free surface on screened refractory metallurgy areas on a ceramic substrate wherein a thin layer of Pd is deposited over the metallurgy areas and the metallurgy areas subsequently sintered causing the surface refractory metal particles to be fused into a substantially solid metallurgy layer under the catalyzing influence of the Pd.

12 Claims, 5 Drawing Figures

4,340,618

PROCESS FOR FORMING REFRACTORY METAL LAYERS ON CERAMIC SUBSTRATE

DESCRIPTION

1. Technical Field

Our invention relates to conductive metal layers on ceramic and glass substrate, more particularly to an improved process for forming a screened and sintered refractory metal layer on a ceramic substrate which metal layer is firmly secured to the substrate and has a top surface that is substantially free of glass.

2. Background Art

In semiconductor packaging technology, it is well known to form metallurgy on a ceramic substrate by screening a refractory metal paste to the desired surface pattern, sintering and subsequently plating the surface screened areas with a nickel, or other solderable layer, deposited by electro or electroless plating techniques. This general process for forming multi-layer ceramic substrates and the associated surface metallurgy is described in an article entitled "A Fabrication Technique For Multilayer Ceramic Modules" by H. D. Kaiser, et al in *Solid State Technology*, May 1972, Pgs. 35–40. IBM Technical Disclosure Bulletin Vol. 17 No. 8 January 1975 P. 2331 and IBM Technical Disclosure Bulletin Vol. 12 No. 11 April 1970 P. 1795 disclose additional embodiments of related metallurgy for use on ceramic substrates. Difficulty has been experienced in forming crack-free firmly adherent nickel or other solderable layers, on a sintered refractory metal pad. Various cleaning techniques, such as described in IBM Technical Disclosure Bulletin Vol. 19 No. 11 April 1977 P. 4158, has been proposed to improve plating quality. Also alloying with Pt, Pd of the refractory metal have been proposed, as in IBM Technical Disclosure Bulletin Vol. 19 No. 3 August 1976 P. 929. In spite of these measures, difficulty remains in depositing crack-free, adherent, metal layers of uniform thickness over refractory metal pads that have been subjected to a sintering cycle.

DISCLOSURE OF INVENTION

In accordance with the present invention, we provide a process of forming glass-free surface on a refractory metallurgy pad that is suitable for further plating of metallic layers or other processes, which process involves depositing by screening technique a refractory metal layer on a ceramic substrate, the middle of the layer being selected from the group consisting of Mo, W, and Ta, depositing a thin layer of a material that will activate the refractory metal particles during a sintering operation which layer has a thickness of approximately 40 to 50 Å per each mil thickness of the metallurgy sublayer, and exposing the substrate with the refractory metal layer and activating layer to a sintering temperature for a time sufficient to sinter the metallurgy layer and also fuse the layer to the substrate.

During the sintering operation, glass from the ceramic substrate will be drawn up into the screened metallurgy layer which forms an adhering bond between the screened refractory layer and the substrate which is a favorable result. However, the activating layer on the surface of the refractory metallurgy layer simultaneously causes the refractory metal particles to be sintered or fused into a substantially solid metallurgy layer, thereby preventing the glass material from the substrate from appearing on the surface of the refractory metal layer.

It is an object of our invention to provide a substantially continuous metal layer on the top surface of a refractory metallurgy layer that has been screened on a substrate which substantially continuous layer is adapted to deposition of additional layers.

Yet another object of this invention is to provide a process for forming a dependable adherent solderable pad layer on a ceramic substrate.

BRIEF DESCRIPTION OF THE DRAWINGS

The details of our invention will be described in connection with the accompanying drawings in which.

BEST MODE FOR CARRYING OUT THE INVENTION

We have discovered that a completely densified and essentially glass-free surface can be induced to form on the external co-fired molybdenum or tungsten conductive features of a ceramic substrate by the prior treatment of the green laminate with a suitable agent to promote metal sintering in accordance with the method hereinafter described, but otherwise fabricated in accordance with the usual methods of substrate fabrication. Substrates so treated with the sintering agent will have external circuit features that are densely sintered and free from glassy inclusions or films on their surfaces so that they can be reliably plated upon with suitable metals such as nickel or the like or directly brazed to leads, caps, etc. with suitable brazing metals and alloys such as copper, copper-palladium, etc. without the need for prior cleaning procedures aimed at glass removal.

Figure 1:
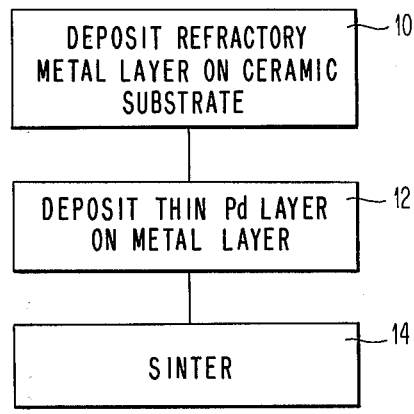
FIG. 1 is a diagram that illustrates the basic process step of the invention.

Referring now to the drawings, FIG. 1 depicts the general procedure for producing an essentially glass-free surface on the screened areas of refractory metal on either a green ceramic substrate or a previously sintered ceramic substrate. Starting with either a green ceramic substrate, as for example, a multilayered ceramic substrate fabricated in the manner described in "A Fabrication Technique For Multilayer Ceramic Modules", H. Kaiser et al, *Solid State Technology*, May 1, 1972, P. 35–40, or a previously sintered substrate, a conductive metal surface pattern of a refractory metal paste is screened on the substrate as indicated by step 10. The metal paste can be any suitable type that includes 1 or more refractory metals and a vehicle, as for example the type indicated in IBM Technical Disclosure Bulletin Vol. 22, No. 4, September 1979, P. 1435. The size of the particles of the paste are preferably in the range of 1 to 5 microns. The vehicle is present in the paste in an amount of 75 to 85% by weight of the metal particles.

The paste can be screened with any suitable apparatus, as for example, by the apparatus described and claimed in U.S. Pat. No. 3,384,931. The thickness of the paste area is normally in the range of 0.5 to 5 mils. The preferred refractory metals used in the paste are molybdenum and tungsten. Following the deposition of the refractory metal paste areas, a thin layer of metal that will catalyze sintering of the refractory metal particles in the paste of the screened-on layer is deposited as indicated by step 12. A preferred metal is palladium that can be deposited by any suitable method, as for example by evaporation or sputter deposition, preferably to a thickness in the range of 40 to 50 Å per each mil of thickness of the screened metal layer. The thickness of the catalyzing layer will normally be in the range of 100 to 400 Å. The catalyzing layer can be a blanket layer, or can be selectively applied over only the refractive metal screened areas. When a palladium catalyzing layer is used, it can be deposited over the entire surface area, and the palladium over non-metallized portions of the substrate will evaporate during the sintering step. The substrate is subsequently sintered as indicated in step 14. The sintering will normally take place at a temperature of 1450° to 1600° C. During the sintering step the catalyzing layer deposited over the refractory metal paste areas causes the particles of the metal to quickly sinter and form a relatively continuous surface.

Broadly, the invention in the preferred embodiment of the invention consists of depositing a 30 to 600 Å layer of palladium on a green ceramic substrate formed of alumina and glass frit with or without organic binders and plasticizers, and having screened on conductor patterns containing molybdenum, tantalum or tungsten powders with or without suitable additives and sintering the substrate at temperatures dictated by the particular ceramic formulation, but usually in excess of 1450° C. Due to the action of palladium deposited on the external circuit features, the surface layer of these features sinter early, normally between 800° and 1200° C., and become dense thereby precluding the infiltration of the glassy phase from the ceramic at higher temperatures in the sintering cycle at which the glass will be fluid. The preferred method for depositing palladium is by sputtering or evaporation in vacuum. A further preference, in view of process simplicity it affords is to deposite a blanket layer of palladium on the entire surface of the substrate to be treated in which case the palladium deposited on the ceramic regions volatilizes off and is carried away by the furnace gases at temperatures above 1150° C. in view of the extreme thinness of the deposit and the significant vapor pressure of palladium at these temperatures. This feature obviates the need for mask that would otherwise be needed for selective deposition of palladium only on the circuit features. Other methods for depositing a thin palladium film on the open laminate such as through the use of decomposable palladium salt, such as $PdCl_2$ or organo-palladium compounds can also be used but are less preferable to the vapor deposition of the metal itself.

In the field of powder metallurgy, the catalytic action of small quantities of certain metal additives such as palladium, nickel, platinum, rhodium, etc. in promoting the sintering of molybdenum and tungsten powders is well known. In studies the kinetics and mechanics of the catalytic action of the additives on powder compacts of molybdenum have been investigated and reported, as for example, by R. M. German and Z. A. Munir, *Journal of Less Common Metals* 58 (1978) pp. 61–74 and by I. J. Toth, N. A. Lockington and L. W. Perry, *Journal of Less Common Metals* 9 (1965) pp. 157–167.

The mechanism of sintering catalysis is believed to be the enhanced surface diffusion of molybdenum or tungsten atoms in a thin additive rich surface layer of the powder particles.

Figure 3:
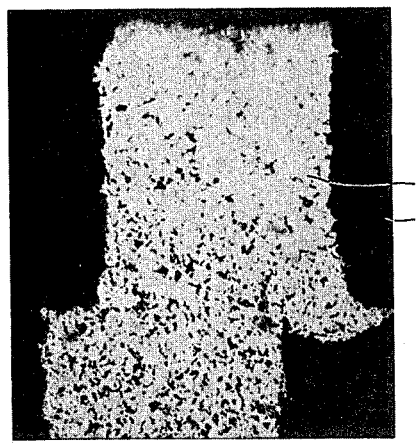
FIG. 3 is a cross-sectional view of a refractory metal via in a multilayer ceramic substrate in a greatly enlarged scale illustrating the surface metallurgy texture of a metallurgy treated in accordance with the method of the invention.
Figure 4:
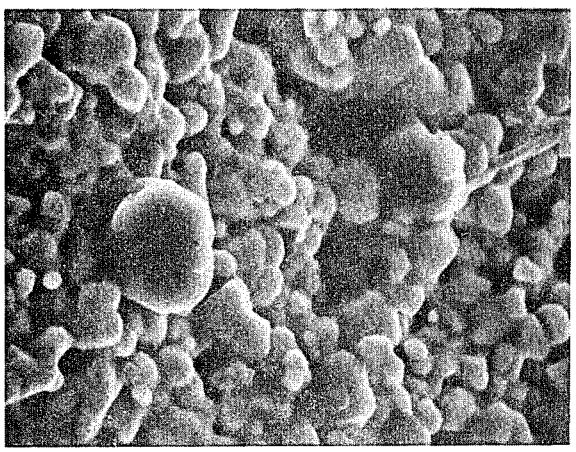
FIG. 4 is a magnified surface view illustrating the texture of a screened refractory metal pad that is produced by prior art technique.
Figure 5:
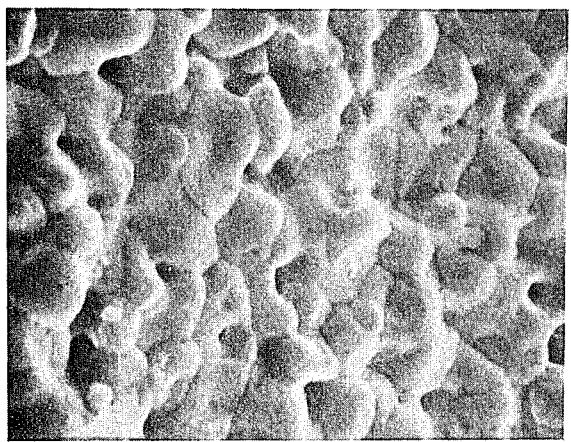
FIG. 5 is a top view, greatly magnified, of a metallurgy pad produced in accordance with the process of the invention.

The resultant sintered metal areas thus have a substantially glass-free top surface that is conductive to further processing by plating additional metal layers, or bonding to associated elements, while allowing for glass infiltration of the lower portion adjacent the interface of the area and supporting the ceramic substrate which results in a firm, strong bond. The change in microstructure with depth of a sintered refractory metal 16 in a ceramic layer 18 is shown in FIG. 3. Note that the metal grain structure at the surface is very dense denoting a substantially pure metal layer free of glass. However, the grain structure changes with depth to indicate a mixture of glass and metal particles where the sintering action is much less complete.

Figure 2:
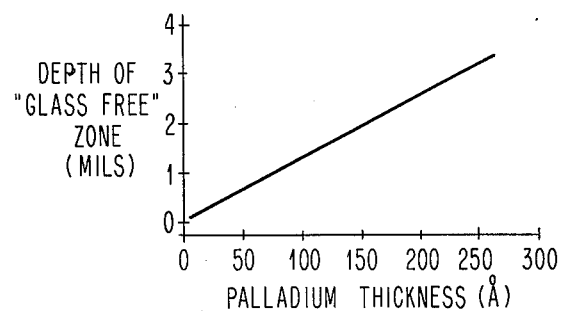
FIG. 2 is a graph of the correlation between activation layer thickness and the depth of the resultant glass-free zone.

Referring now to FIG. 2 there is depicted a graph of depth of glass-free zone versus palladium thickness which was determined from experimental data to indicate the depth of the metal sintering that various thicknesses will provide for different palladium thickness. The factors that govern the required palladium thickness are the ceramic composition, the nature of the glass frit, the choice of the sintering thermal cycle and the sintering ambia. Other factors such as the conductor paste make up also have some influence.

The following example depicts a preferred specific embodiment of the process of the invention and is not intended to limit the scope of the claims thereto.

EXAMPLE I

A plurality of green ceramic sheets having a thickness of 0.008″ were formed by doctor blading and drying a slurry of alumina, glass frit, a polyvinylbutyral resin, methyl-isobutylketone solvents, and methanol. Via holes were subsequently punched in the sheets and surface interconnective metallurgy and the vias filled with a molybdenum paste consisting of molybdenum particles having an average particle size of 2.5 microns, combined with an organic resin vehicle in an amount of 20% by weight. The green sheets were subsequently assembled and pressed to form a green ceramic substrate. Surface features were screened on the substrate utilizing the same molybdenum paste described previously. The thickness of the molybdenum surface features was approximately 4 mils. A layer of palladium having a thickness of 150 Å was deposited on the entire surface of the substrate by evaporation techniques. Subsequently, the substrate was sintered in a wet $H_2$ ambient at a temperature of 1600° C. for a time of 4 hours. After the substrate was cooled the surface of the molybdenum surface features was examined under magnification and found to be substantially glass-free and presenting a uniform solid surface of molybdenum grain. The surface features were securely adhered to the sintered substrate.

EXAMPLE II

A green multi-layer ceramic substrate was prepared in the manner described in Example I with the same materials and conductive molybdenum paste. After the surface features were screened on, the substrate was immediately sintered without depositing a palladium layer. The sintering was done at the same time, temperature and ambient. After the substrate was allowed to cool, the surface of the conductive features were examined under magnification. It was noted that the surface features contained exposed glass frit areas and the molybdenum grains were not developed as the substrate in Example I.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A process of forming a glass free surface on refractory metallurgy pads on ceramic substrate, comprising
   depositing by screening techniques a refractory metallurgy layer on a ceramic substrate, the metal of said layer selected from the group consisting of Mo, W and Ta,
   depositing a thin layer of Pd on at least the surface of said metallurgy layer of a thickness that is approximately 40-50 angstroms per each mil thickness of said metallurgy layer,
   exposing said substrate to a sintering temperature for a time sufficient to sinter the metallurgy layer and also to fuse the layer to said substrate.

2. The process of claim 1 wherein said metallurgy layer is deposited on an unsintered ceramic substrate, and the ceramic material of said substrate is sintered simultaneously with said metallurgy layer.

3. The process of claim 1 wherein said metallurgy layer is deposited on a sintered ceramic substrate.

4. The process of claim 1 wherein said metallurgy layer has a thickness in the range of 0.5 to 5 mil.

5. The process of claim 4 wherein said Pd layer has a thickness in the range of 30 to 600 Angstroms.

6. The process of claim 5 wherein said Pd layer is deposited by evaporation techniques.

7. The process of claim 5 wherein said Pd layer is a blanket layer over the top surface of said substrate.

8. The process of claim 1 wherein said Pd layer is a blanket layer over the top surface of said substrate.

9. The process of claim 1 wherein said refractory metallurgy layer is Mo.

10. The process of claim 9 wherein said metallurgy layer includes from 0 to 5% of glass frit by weight.

11. The process of claim 1 wherein a Ni layer is deposited over the sintered metallurgy layer by electroless deposition techniques.

12. The process of claim 1 wherein a layer of braze metal is melted over said metallurgy layer, said braze metal selected from the group consisting of Cu, Au, Pb, Sn and alloys thereof.

* * * * *